US010377921B2

(12) United States Patent
Theivanayagam et al.

(10) Patent No.: US 10,377,921 B2
(45) **Date of Patent: *Aug. 13, 2019**

(54) CHEMICAL MECHANICAL POLISHING METHOD FOR COBALT

(71) Applicant: Rohm and Haas Electronic Materials CMP Holdings, Inc., Newark, DE (US)

(72) Inventors: Murali G. Theivanayagam, New Castle, DE (US); Hongyu Wang, Wilmington, DE (US); Matthew Van Hanehem, Middletown, DE (US)

(73) Assignee: Rohm and Haas Electronics Materials CMP Holdings, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/710,898

(22) Filed: Sep. 21, 2017

(65) Prior Publication Data

US 2019/0085206 A1 Mar. 21, 2019

(51) Int. Cl.

| | |
|---|---|
| ***C09G 1/02*** | (2006.01) |
| ***C09K 3/14*** | (2006.01) |
| ***C09G 1/00*** | (2006.01) |
| ***H01L 21/304*** | (2006.01) |
| ***H01L 21/461*** | (2006.01) |
| ***H01L 21/306*** | (2006.01) |
| ***H01L 21/321*** | (2006.01) |

(52) U.S. Cl.

CPC ................. *C09G 1/02* (2013.01); *C09G 1/00* (2013.01); *C09K 3/14* (2013.01); *C09K 3/1454* (2013.01); *C09K 3/1463* (2013.01); *H01L 21/304* (2013.01); *H01L 21/30625* (2013.01); *H01L 21/3212* (2013.01); *H01L 21/461* (2013.01)

(58) Field of Classification Search

None

See application file for complete search history.

(56) References Cited

U.S. PATENT DOCUMENTS

| | | | | |
|---|---|---|---|---|
| 9,528,030 B1 | 12/2016 | Kraft et al. | | |
| 2002/0005017 A1* | 1/2002 | Motonari | C09G 1/02 | 428/693.1 |
| 2011/0318929 A1* | 12/2011 | Mishima | C09G 1/02 | 252/79.1 |
| 2013/0045599 A1* | 2/2013 | Ye | C09G 1/02 | 438/693 |
| 2013/0140273 A1 | 6/2013 | Lu et al. | | |
| 2013/0186850 A1 | 7/2013 | Wang et al. | | |
| 2014/0011362 A1 | 1/2014 | Reichardt et al. | | |
| 2014/0243250 A1 | 8/2014 | Miller et al. | | |
| 2016/0027657 A1 | 1/2016 | Shi et al. | | |
| 2016/0068710 A1 | 3/2016 | Wang et al. | | |
| 2016/0079080 A1* | 3/2016 | Mishra | C09G 1/02 | 438/693 |
| 2016/0108286 A1 | 4/2016 | Sikma et al. | | |
| 2016/0115353 A1 | 4/2016 | Kraft et al. | | |
| 2017/0009101 A1* | 1/2017 | Yasui | B24B 37/044 | |

FOREIGN PATENT DOCUMENTS

| | | | |
|---|---|---|---|
| CN | 104830235 A | 8/2015 | |
| JP | 2011-003665 A | 1/2011 | |
| JP | 2014-229827 A | 12/2014 | |
| WO | 2015/129342 * | 9/2015 | C09G 1/02 |
| WO | 2016/008896 A1 | 1/2016 | |
| WO | 2017/025536 A1 | 2/2017 | |

OTHER PUBLICATIONS

Nolan et al, Copper CMP: The Relationship Between Polish Rate Uniformity and Lubrication, ECS Journal of Solid State Science and Technoloty, vol. 4 p. 157-163 (Year: 2012).*

Co-pending U.S. Appl. No. 15/710,892.

* cited by examiner

*Primary Examiner* — Stephanie P Duclair

(74) *Attorney, Agent, or Firm* — John J. Piskorski

(57) ABSTRACT

A process for chemical mechanical polishing a substrate containing cobalt and TiN to planarize the surface and at least improve surface topography of the substrate. The process includes providing a substrate containing cobalt and TiN; providing a polishing composition, containing, as initial components: water; an oxidizing agent; aspartic acid or salts thereof; and, colloidal silica abrasives with diameters of ≤25 nm; and, providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the cobalt is polished away to planarize the substrate to provide improved cobalt: TiN removal rate selectivity.

4 Claims, No Drawings

CHEMICAL MECHANICAL POLISHING METHOD FOR COBALT

FIELD OF THE INVENTION

The present invention is directed to the field of chemical mechanical polishing of cobalt to at least improve the removal rate selectivity of cobalt over TiN. More specifically, the present invention is directed to a method for chemical mechanical polishing of cobalt to at least improve the removal rate selectivity of cobalt over TiN by providing a substrate containing cobalt, and TiN; providing a polishing composition, containing, as initial components: water; an oxidizing agent; aspartic acid or salts thereof; a colloidal silica abrasive having an average particle diameter of less than or equal to 25 nm; providing a chemical mechanical polishing pad, having a polishing surface; creating dynamic contact at an interface between the polishing pad and the substrate; and dispensing the polishing composition onto the polishing surface at or near the interface between the polishing pad and the substrate where some of the cobalt is polished away from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a particular material.

For advanced technical nodes, 10 nm and below, cobalt is being implemented to replace tungsten plugs connecting transistor gates to metal interconnects in Back End of Line (BEOL) and replace copper in metal lines and vias for the first few metal layers in BEOL. Cobalt will be deposited on top of Ti/TiN barrier layers in these schemes. All these new processes require CMP to achieve planarity to the desired targeted thickness and selectivity of materials.

For efficient performance the CMP industry requires cobalt slurry to deliver high cobalt removal rates of 1500 Å/min or greater and simultaneously demonstrate low barrier (for example TiN) removal rates for acceptable topographical control. Barrier layers separate conductive materials from non-conductive insulator dielectric materials such as TEOS and inhibit unwanted electro-migration from one layer to the next. Excessive barrier removal can result in electro-migration resulting in the semiconductor device malfunctioning. As the semiconductor industry is continually driven to improve chip performance by further miniaturization of devices the dimensions of the various materials becomes smaller and thinner and features on semiconductors become denser making CMP ever more challenging to provide the desired removal rates of metals such as cobalt and simultaneously prevent excessive removal of barrier layers and insulator materials to prevent mal-functioning of semiconductor devices.

Therefore, there is a need for a CMP polishing method and composition for cobalt which at least improves cobalt: TiN barrier removal rate selectivity.

SUMMARY OF THE INVENTION

The present invention provides a method of chemical mechanical polishing cobalt, comprising: providing a substrate comprising cobalt and TiN; providing a chemical mechanical polishing composition, comprising, as initial components: water; an oxidizing agent; aspartic acid or salts thereof in amounts of at least 0.1 wt %; a colloidal silica abrasive having an average particle diameter of 25 nm or less; and, optionally, a corrosion inhibitor; optionally, a surfactant; optionally, a biocide; optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt is polished away from the substrate.

The present invention provides a method of chemical mechanical polishing cobalt, comprising: providing the substrate comprising cobalt and TiN; providing a chemical mechanical polishing composition, comprising, as initial components: water; an oxidizing agent; aspartic acid or salts thereof in amounts of 0.1 wt % to 5 wt %; a colloidal silica abrasive having a particle diameter of 5 nm to 25 nm and a negative zeta potential; a pH greater than 6; optionally, a corrosion inhibitor; optionally, a surfactant; optionally, a biocide; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt is polished away from the substrate; wherein the chemical mechanical polishing composition provided has a cobalt removal rate of ≥1500 Å/min with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad.

The present invention provides a method of chemical mechanical polishing cobalt, comprising: providing a substrate comprising cobalt and TiN; providing a chemical mechanical polishing composition, comprising, as initial components: water; 0.01 wt % to 2 wt % of an oxidizing agent, wherein the oxidizing agent is hydrogen peroxide; aspartic acid or salts thereof in amounts of 0.1 wt % to 3 wt %; a colloidal silica abrasive having an average particle diameter of 10 nm to 24 nm and a negative zeta potential; a pH of 7 to 9; optionally, a corrosion inhibitor selected from the groups consisting of a heterocyclic nitrogen compound, a polycarboxylic acid and mixtures thereof; optionally, a surfactant; optionally a biocide; and, optionally, a pH adjusting agent; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt is polished away from the substrate; wherein the chemical mechanical polishing composition provided has a cobalt removal rate of ≥1500 Å/min with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; wherein the chemical mechanical polishing pad comprises a polyurethane polishing layer containing polymeric hollow core microparticles and a polyurethane impregnated non-woven subpad.

The present invention provides a method of chemical mechanical polishing cobalt, comprising: providing the substrate comprising cobalt and TiN; providing a chemical mechanical polishing composition, comprising, as initial components: water; 0.1 wt % to 1 wt % of an oxidizing agent, wherein the oxidizing agent is hydrogen peroxide; 0.3 wt % to 1 wt % of aspartic acid or salt thereof; 0.3 to 2 wt % of a colloidal silica abrasive having an average particle diameter of 20 nm to 23 nm and a negative zeta potential; a pH of 7.5 to 9; optionally, 0.001 wt % to 1 wt % of a corrosion inhibitor selected from the group consisting of a heterocyclic nitrogen compound, a polycarboxylic acid and mixtures thereof; optionally, a surfactant; and, optionally, a pH adjusting agent; optionally, a biocide; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt is polished away from the substrate.

The present invention provides a method of chemical mechanical polishing cobalt, comprising: providing a substrate comprising cobalt and TiN; providing a chemical mechanical polishing composition, comprising, as initial components: water; 0.1 wt % to 0.5 wt % of an oxidizing agent, wherein the oxidizing agent is hydrogen peroxide; 0.3 wt % to 1 wt % of aspartic acid or salt thereof, 0.3 wt % to 1.5 wt % of a colloidal silica abrasive having and average diameter of 20 nm to 23 nm and a negative surface charge; optionally, 0.005 wt % to 0.1 wt % of a corrosion inhibitor selected from the group consisting of a heterocyclic nitrogen compound, a polycarboxylic acid and mixtures thereof, wherein the heterocyclic nitrogen compound is selected from the group consisting of adenine, 1,2,4-triazole, imidazole, polyimidazole and mixtures thereof, and wherein the polycarboxylic acid is selected from the group consisting of adipic acid, maleic acid, malic acid, salts thereof and mixtures thereof; a pH of 8 to 9; and, a pH adjusting agent, wherein the pH adjusting agent is KOH; and, optionally, a surfactant; optionally a biocide; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein some of the cobalt is polished away from the substrate.

The foregoing methods of the present invention use a chemical mechanical polishing composition comprising, as initial components, water; aspartic acid or salts thereof in amounts of at least 0.1 wt %; an oxidizing agent; a colloidal silica abrasive having an average particle diameter of 25 nm or less; and, optionally, a corrosion inhibitor; optionally, a surfactant; and, optionally, a pH adjusting agent; and, optionally, a biocide to polish cobalt at a high polishing rate to remove at least some of the cobalt to provide high cobalt:TiN removal rate selectivity.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; μ=μm=microns; kPa=kilopascal; Å=angstroms; mV=millivolts; DI=deionized; mm=millimeters; cm=centimeter; min=minute; sec=seconds; rpm=revolutions per minute; lbs=pounds; kg=kilograms; Co=cobalt; Ti=titanium; TiN=titanium nitride; $H_2O_2$=hydrogen peroxide; KOH=potassium hydroxide; wt %=weight percent; PVD=physical vapor deposited; RR=removal rate; PS=polishing slurry; and CS=control slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "aspartic acid" means the α-amino acid and can include L-aspartic acid, D-aspartic acid, or racemic mixtures thereof. The term "TEOS" means the silicon dioxide formed from the decomposition of tetraethyl orthosilicate ($Si(OC_2H_5)_4$). The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing a substrate of the present invention, wherein the substrate includes cobalt and TiN, uses a chemical mechanical polishing composition which contains, as initial components, water; an oxidizing agent; aspartic acid or salts thereof in amounts of at least 0.1 wt %; a colloidal silica abrasive having an average particle diameter of less than or equal to 25 nm; and, optionally, a corrosion inhibitor; optionally, a surfactant; optionally, a biocide; and optionally, a pH adjusting agent for the removal of at least some of the cobalt from the substrate surface and inhibit TiN removal rate to provide at least high cobalt:TiN removal rate selectivity.

Preferably, the method of polishing a substrate of the present invention, comprises: providing the substrate, wherein the substrate comprises cobalt and TiN; providing a chemical mechanical polishing composition, comprising, preferably, consisting of, as initial components: water; an oxidizing agent, preferably, in amounts of 0.01 wt % to 2 wt %, more preferably in amounts of 0.1 wt % to 1 wt %, even more preferably from 0.1 wt % to 0.5 wt %; aspartic acid or salts thereof or mixtures thereof in amounts of equal to or greater than 0.1 wt %, preferably, 0.1 wt % to 5 wt %, more preferably, 0.1 wt % to 3 wt %, even more preferably, from 0.3 wt % to 1 wt %, even still more preferably, from 0.3 wt % to 0.9 wt %; and most preferably, from 0.5 wt % to 0.9 wt %; a colloidal silica abrasive having an average particle diameter of 25 nm or less, preferably, in amounts of 0.01 wt % to 5 wt %, more preferably, from 0.01 wt % to 3 wt %; even more preferably, in amounts of 0.3 wt % to 3 wt %, still further preferably from 0.3 wt % to 2 wt %, most preferably, from 0.3 wt % to 1.5 wt %; and, optionally a biocide; optionally, a corrosion inhibitor, preferably, in amounts of 0.001 wt % to 1 wt %, more preferably, from 0.001 wt % to 0.5 wt %, even more preferably from 0.005 wt % to 0.1 wt %; optionally, a surfactant; and, optionally, a pH adjusting agent; wherein the chemical mechanical polishing composition has a pH of greater than 6; preferably, 7 to 9; more preferably, from 7.5 to 9; even more preferably, from 8 to 9; and most preferably from 8 to 8.5; providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the cobalt is polished away from the substrate.

Preferably, in the method of polishing a substrate of the present invention, the water contained, as an initial component, in the chemical mechanical polishing composition provided is at least one of deionized and distilled to limit incidental impurities.

Preferably, in the method of polishing a substrate of the present invention, the chemical mechanical polishing composition provided contains, as an initial component, an oxidizing agent, wherein the oxidizing agent is selected from the group consisting of hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from the group consisting of hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains, as an initial component, 0.01 wt % to 2 wt %, more preferably, 0.1 wt % to 1 wt %; even more preferably 0.1 wt % to 0.5 wt %; most preferably, 0.2 wt % to 0.4 wt % of an oxidizing agent.

Preferably, in the method of polishing a substrate of the present invention, the chemical mechanical polishing composition provided contains, as an initial component, aspartic acid, salts of aspartic acid, or mixtures thereof in amounts of at least 0.1 wt %. Salts of aspartic acid include, but are not limited to, L-aspartic acid sodium salt monohydrate, L-aspartic acid potassium salt and DL-aspartic acid potassium salt. Preferably, in the method of polishing a substrate of the present invention, L-aspartic acid is included in the chemical mechanical polishing composition of the present invention. In the method of polishing a substrate of the present invention, the chemical mechanical polishing composition provided contains, as an initial component, preferably, 0.1 wt % to 5 wt %, more preferably, 0.1 wt % to 3 wt %, even more preferably, from 0.3 wt % to 1 wt %, even still more preferably from 0.3 wt % to 0.9 wt %, and most preferably, from 0.5 wt % to 0.9 wt % of L-aspartic acid, D-aspartic acid, racemic mixtures, salts thereof, or mixtures thereof.

Preferably, in the method of polishing a substrate of the present invention, the chemical mechanical polishing composition provided contains a colloidal silica abrasive having a particle diameter of 25 nm or less and a negative zeta potential. More preferably, in the method of polishing a substrate of the present invention, the chemical mechanical polishing composition provided contains a colloidal silica abrasive having an average particle diameter of 25 nm or less and a permanent negative zeta potential, wherein the chemical mechanical polishing composition has a pH of greater than 6, preferably, from 7 to 9; more preferably, of 7.5 to 9; and still more preferably, from 8 to 9, most preferably from 8 to 8.5. Still more preferably, in the method of polishing a substrate of the present invention, the chemical mechanical polishing composition provided contains a colloidal silica abrasive having an average particle diameter of 25 nm or less and a permanent negative zeta potential, wherein the chemical mechanical polishing composition has a pH of greater than 6, preferably, from 7 to 9; more preferably, of 7.5 to 9; still more preferably, of 8 to 9, most preferably from 8 to 8.5, wherein a zeta potential is from −0.1 mV to −35 mV.

Preferably, in the method of polishing a substrate of the present invention, the chemical mechanical polishing composition provided contains, as an initial component, a colloidal silica abrasive having an average particle diameter of 25 nm or less, preferably, 5 nm to 25 nm; more preferably, 5 nm to less than 25 nm; even more preferably from 10 nm to 24 nm, still more preferably from 10 nm to 23 nm, most preferably, 20 nm to 23 nm, as measured by dynamic light scattering techniques. Suitable particle size measuring instruments are available from, for example, Malvern Instruments (Malvern, UK).

Preferably, the colloidal silica abrasives are spherical in contrast to cocoon shaped colloidal silica abrasives which are conjoined or combined spheres. Spherical colloidal silica particles are not conjoined spheres. Size of spherical colloidal silica particles is measured by the diameter of the particle. In contrast, the size of cocoon particles, which are conjoined spheres, is the diameter of the smallest sphere that encompasses the particle and the length of the particle. Examples of commercially available spherical colloidal silica particles are Fuso PL-2L (average particle diameter of 23 nm) available from Fuso Chemical Co., LTD and K1598-B-12 (average particle diameter of 20 nm) available from EMD Performance Materials, Merck KGaA. Examples of a commercially available cocoon colloidal silica particles are Fuso SH-3 (53 nm average particle diameter colloidal silica particle forming conjoined spheres having an average length of 70 nm) and Fuso PL-2 (37 nm average particle diameter colloidal silica particles forming conjoined spheres having an average length of 70 nm) which are also available from Fuso Chemical Co., LTD.

Preferably, in the method of polishing a substrate of the present invention, the chemical mechanical polishing composition provided contains, as initial components, preferably, in amounts of 0.01 wt % to 5 wt %, more preferably, from 0.01 wt % to 3 wt %; even more preferably, in amounts of 0.3 wt % to 3 wt %, still more preferably, from 0.3 wt % to 2 wt %, most preferably, from 0.3 wt % to 1.5 wt % of a colloidal silica abrasive having a particle diameter of less than or equal to 25 nm, preferably, 5 nm to 25 nm; more preferably, 5 nm to less than 25 nm; even more preferably from 10 nm to 24 nm, still more preferably from 10 nm to 23 nm, most preferably, 20 nm to 23 nm, as measured by dynamic light scattering techniques. Preferably the colloidal silica abrasive has a permanent negative zeta potential.

Optionally, in the method of polishing a substrate of the present invention, the chemical mechanical polishing composition provided contains, as an initial component, a corrosion inhibitor, wherein the corrosion inhibitor is selected from the group consisting of a heterocyclic nitrogen compound, a nonaromatic polycarboxylic acid, and mixtures thereof, wherein the heterocyclic nitrogen compound is selected from the group consisting of adenine, 1,2,4-triazole, imidazole, polyimidazole and mixtures thereof; and, wherein the nonaromatic polycarboxylic acid includes, but is not limited to oxalic acid, succinic acid, adipic acid, maleic acid, malic acid, glutaric acid, citirc acid, salts thereof or mixtures thereof. Preferably, the salts of the foregoing nonaromatic polycarboxylic acids are chosen from one or more of sodium, potassium and ammonium salts. When the chemical mechanical polishing composition includes a heterocyclic nitrogen compound in the method of chemical mechanical polishing a substrate of the present invention, preferably, as an initial component, the heterocyclic nitrogen compound is adenine. When the chemical mechanical polishing composition includes a nonaromatic polycarboxylic acid in the method of polishing a substrate of the present invention, the chemical mechanical polishing composition provided contains, as an initial component, preferably, the nonaromatic polycarboxylic acid selected from the group consisting of malic acid, oxalic acid, adipic acid, citric acid, salts thereof and mixtures thereof. More preferably when the chemical mechanical polishing composition provided contains, as an initial component, a nonaromatic polycarboxylic acid, the nonaromatic polycarboxylic acid is selected from the group consisting of malic acid, citric acid, adipic acid, salts thereof and mixtures thereof. Most preferably in the method of polishing a substrate of the present invention, when the chemical mechanical polishing composition provided contains, as an initial component, a nonaromatic polycarboxylic acid, the nonaromatic polycarboxylic acid is the nonaromatic dicarboxylic acid adipic acid or salts thereof, wherein, preferably, the salts are selected from the group consisting of sodium adipate, potassium adipate and ammonium adipate.

When a corrosion inhibitor is included in the method of polishing a substrate of the present invention, the chemical mechanical polishing composition provided contains, as an initial component, 0.001 wt % to 1 wt %, more preferably, from 0.001 wt % to 0.5 wt %, even more preferably from 0.005 wt % to 0.1 wt % of a corrosion inhibitor selected from the group consisting of a heterocyclic nitrogen compound, a nonaromatic polycarboxylic acid and mixtures thereof, wherein the heterocyclic nitrogen compounds are selected from the group consisting of adenine, 1,2,4-triazole, imidazole, polyimidazole and mixtures thereof; and, wherein the nonaromatic polycarboxylic acid is selected from the group consisting of oxalic acid, succinic acid, adipic acid, maleic acid, malic acid, glutaric acid, citric acid, salts thereof and mixtures thereof. Preferably, in the method of polishing a substrate of the present invention, the chemical mechanical polishing composition provided contains, as an initial component, 0.001 to 1 wt %, more preferably, 0.001 to 0.5 wt %, even more preferably, 0.005 wt % to 0.1 wt %, most preferably, 0.01 to 0.1 wt %, of the heterocyclic nitrogen compound adenine; and, the dicarboxylic acid adipic acid, salts of adipic acid, or mixtures thereof, wherein the salts are preferably selected from the group consisting of sodium adipate, potassium adipate and ammonium adipate.

It is most preferred that when a corrosion inhibitor is included in the method of chemical mechanical polishing a substrate of the present invention, the chemical mechanical polishing composition includes, as an initial component, a nonaromatic polycarboxylic or salt thereof, wherein the nonaromatic polycarboxylic acid or salt thereof is a nonaromatic dicarboxylic acid or salt thereof selected from the group consisting of adipic acid, salt of adipic acid, malic acid, salt of malic acid, maleic acid, salt of maleic acid and mixtures thereof; and, most preferably, with the exception of adenine, wherein the chemical mechanical polishing composition is free of azole corrosion inhibitors and derivatives of azole corrosion inhibitors as well as heterocyclic nitrogen compound corrosion inhibitors.

In the method of polishing a substrate of the present invention, the chemical mechanical polishing composition provided has a pH of greater than 6. Preferably, in the method of polishing a substrate of the present invention, the chemical mechanical polishing composition provided has a pH of 7 to 9; more preferably, in the method of polishing a substrate of the present invention, the chemical mechanical polishing composition provided has a pH of 7.5 to 9. Even more preferably, in the method of polishing a substrate of the present invention, the chemical mechanical polishing composition provided has a pH of 8 to 9, most preferably, the chemical mechanical polishing composition provided has a pH of 8 to 8.5.

Preferably, in the method of polishing a substrate of the present invention, the chemical mechanical polishing composition provided, optionally, contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Optionally, in the method of the present invention, the chemical mechanical polishing composition contains biocides, such as KORDEK™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON and KORDEK are trademarks of The Dow Chemical Company).

In the method of polishing a substrate of the present invention, optionally, the chemical mechanical polishing composition provided can contain, as an initial component, 0.001 wt % to 0.1 wt %, preferably, 0.001 wt % to 0.05 wt %, more preferably, 0.01 wt % to 0.05 wt %, still more preferably, 0.01 wt % to 0.025 wt %, of biocide.

Optionally, in the method of the present invention, the chemical mechanical polishing composition can further include defoaming agents, such as non-ionic surfactants including esters, ethylene oxides, alcohols, ethoxylate, silicon compounds, fluorine compounds, ethers, glycosides and their derivatives. Anionic ether sulfates such as sodium lauryl ether sulfate (SLES) as well as the potassium and ammonium salts. The surfactant can also be an amphoteric surfactant.

In the method of polishing a substrate of the present invention, optionally, the chemical mechanical polishing composition provided can contain, as an initial component, 0.001 wt % to 0.1 wt %, preferably, 0.001 wt % to 0.05 wt %, more preferably, 0.01 wt % to 0.05 wt %, still more preferably, 0.01 wt % to 0.025 wt %, of a surfactant.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

In the method of polishing a substrate of the present invention, the chemical mechanical polishing composition provided has a cobalt removal rate≥1500 Å/min; preferably, ≥1800 Å/min; more preferably, ≥1900 Å/min; still more preferably, ≥2200 Å/min, even further preferably, ≥2300 Å/min; and a Co:TiN selectivity of ≥30:1; preferably, a Co:TiN selectivity of ≥31:1; more preferably, a Co:TiN selectivity of ≥34:1; still more preferably, a Co:TiN selectivity of ≥40:1; most preferably, a Co:TiN selectivity of ≥50:1; and, wherein a further preferred range of Co:TiN selectivity is from 31:1 to 55:1; and, with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad.

The following examples are intended to illustrate the removal rate selectivity of Co:TiN of one or more embodiments of the present invention but are not intended to limit its scope.

Example 1

Slurry Formulations

All the slurries in Tables 1 and 2 used for polishing studies were prepared as mentioned in the following procedure. L-aspartic acid, adipic acid, adenine and KORDEK™ MLX were added to de-ionized water and mixed using an overhead stirrer (300-450 RPM) until completely dissolved to make a final L-aspartic acid concentration of 0.9 wt % or 0.5 wt %, a final adipic acid concentration of 0.1 wt %, a final adenine concentration of 0.05 wt %, and a final KORDEK™ MLX concentration of 0.005 wt % followed by pH adjustment to pH greater than 7 with dilute KOH solution (5% or 45%). The following colloidal silica particles were obtained from Fuso chemical Co., LTD: Fuso PL-2L (23 nm average diameter spherical colloidal silica particles, 20 wt % solids as received) and Fuso PL-2 (37 nm average diameter cocoon shaped colloidal silica particles forming conjoined spheres having an average length of 70 nm, 20 wt % solids as received). Each type of the colloidal silica particles were added at specified wt % to a separate slurry while stirring with a final pH adjustment to 8 using KOH. Cleanroom grade $H_2O_2$ (30% solution) was added with stirring to achieve 0.4 wt % or 0.2 wt % $H_2O_2$ concentration in the final slurry. The slurries were used on the same day $H_2O_2$ was added to the slurries in the polishing experiments.

TABLE 1

Slurries of the Invention

| Slurry # | L-Aspartic Acid (wt %) | Adipic Acid (wt %) | Adenine (wt. %) | Kordek ™ MLX (wt %) | Abrasive Type (wt %) | $H_2O_2$ (wt %) | pH |
|---|---|---|---|---|---|---|---|
| PS-1 | 0.9 | — | | — | Fuso-PL-2L (1.5%) | 0.4 | 8 |
| PS-2 | 0.5 | 0.1 | — | 0.005 | Fuso-PL-2L (3%) | 0.2 | 8 |
| PS-3 | 0.5 | 0.1 | — | 0.005 | Fuso-PL-2L (1.5%) | 0.2 | 8 |
| PS-4 | 0.5 | 0.1 | — | 0.005 | Fuso-PL-2L (0.3%) | 0.2 | 8 |
| PS-5 | 0.5 | — | 0.05 | 0.005 | Fuso-PL-2L (3%) | 0.2 | 8 |
| PS-6 | 0.5 | — | 0.05 | 0.005 | Fuso-PL-2L (1.5%) | 0.2 | 8 |
| PS-7 | 0.5 | — | 0.05 | 0.005 | Fuso-PL-2L (0.3%) | 0.2 | 8 |

TABLE 2

Comparative Slurries

| Slurry # | L-Aspartic Acid (wt %) | Adipic Acid (wt %) | Adenine (wt. %) | Kordek ™ MLX (wt %) | Abrasive Type (wt %) | $H_2O_2$ (wt %) | pH |
|---|---|---|---|---|---|---|---|
| CS-1 | 0.9 | — | | — | Fuso-PL-2 (1%) | 0.4 | 8 |
| CS-2 | 0.5 | 0.1 | | 0.005 | Fuso-PL-2 (3%) | 0.2 | 8 |
| CS-3 | 0.5 | 0.1 | | 0.005 | Fuso-PL-2 (1.5%) | 0.2 | 8 |
| CS-4 | 0.5 | 0.1 | | 0.005 | Fuso-PL-2 (0.3%) | 0.2 | 8 |
| CS-5 | 0.5 | | 0.05 | 0.005 | Fuso-PL-2 (3%) | 0.2 | 8 |
| CS-6 | 0.5 | | 0.05 | 0.005 | Fuso-PL-2 (1.5%) | 0.2 | 8 |

TABLE 2-continued

| Comparative Slurries | | | | | | | |
|---|---|---|---|---|---|---|---|
| Slurry # | L-Aspartic Acid (wt %) | Adipic Acid (wt %) | Adenine (wt. %) | Kordek ™ MLX (wt %) | Abrasive Type (wt %) | $H_2O_2$ (wt %) | pH |
| CS-7 | 0.5 | | 0.05 | 0.005 | Fuso-PL-2 (0.3%) | 0.2 | 8 |

Example 2

Cobalt Polishing Experiments Relating to Co:TiN Selectivity

The following cobalt and TiN polishing experiments were performed with the slurries disclosed in Tables 1 and 2 in Example 1 above.

TABLE 3

| CMP Polishing and Cleaning Conditions | |
|---|---|
| Polishing Tool | Applied MIRRA |
| Pad | IC1010--a polyurethane; Shore D hardness of 57, 30 and 60 μm average diameter closed cell pores and circular grooves having a depth, width and pitch of 760, 510 and 3,050 μm, respectively |
| Conditioner | Saesol 8031C1-170 μm diamond size; 40 μm diamond protrusion and 310 μm diamond spacing |
| Process | 2 PSI (13.8 kPa), 93/87 RPM, 200 ml/min (Downforce, Platen Speed/Carrier Speed, Slurry Flow Rate) |
| Post CMP clean | Synergy - ATMI PlanarClean ™ Composition: Ethanolamine (1 to 10 wt %), Tetramethylammonium hydroxide (1 to 10 wt %), pH >13.5 and dilution 1:20. |
| Polish Time | Co Wafer: 20 sec and TiN Wafer: 30 sec (polishing times were set different for Co and TiN due to the differences in their removal rates and film thickness and the need to have sufficient Co film remaining to measure the removal rates accurately) |
| Wafers | 200 mm PVD cobalt wafer obtained from Novati (~1700 Å thick) and 200 mm TiN wafer obtained from Wafernet (~2000 Å thick) |

The polished wafers were passed through a DSS-200 Synergy™ (OnTrak) double-sided wafer scrubber running ATMI PlanarClean chemistry, cobalt and TiN removal rates were measured with RS200 metal film thickness measurement tool by KLA Tencor. Polishing results are in Table 4.

TABLE 4

| CMP Polishing Results | | | |
|---|---|---|---|
| Slurry # | PVD Co RR (Å/min) | TiN RR (Å/min) | Selectivity Co:TiN |
| PS-1 | 2357 | 76 | 31 |
| PS-2 | 2391 | 870 | 3 |
| PS-3 | 2261 | 67 | 34 |
| PS-4 | 2306 | 42 | 55 |
| PS-5 | 1754 | 612 | 3 |
| PS-6 | 1808 | 43 | 42 |
| PS-7 | 1972 | 41 | 48 |
| CS-1 | 3192 | 1422 | 2 |
| CS-2 | 2856 | 1902 | 2 |
| CS-3 | 2754 | 1445 | 2 |
| CS-4 | 2477 | 789 | 3 |

TABLE 4-continued

| CMP Polishing Results | | | |
|---|---|---|---|
| Slurry # | PVD Co RR (Å/min) | TiN RR (Å/min) | Selectivity Co:TiN |
| CS-5 | 2654 | 1591 | 2 |
| CS-6 | 2638 | 1225 | 2 |
| CS-7 | 2352 | 541 | 4 |

With the exceptions of PS-2 and PS-5, the results disclosed that the CMP slurries of the present invention which had average particle size diameters of 23 nm had Co:TiN removal rate selectivity values of 31 and greater. In contrast, the comparative slurries which had average particle size diameters of 37 nm had very low Co:TiN removal rate selectivity values of 2 to 4. Overall, the CMP slurries of the present invention showed significant increase of Co:TiN selectivity over the comparative slurries which had larger average particle size diameters and were cocooned shaped particles, not spheres as the CMP slurries of the present invention.

What is claimed is:

1. A method of chemical mechanical polishing cobalt, comprising:
providing a substrate comprising cobalt and TiN;
providing a chemical mechanical polishing composition, consisting of, as initial components:
water;
0.1 wt % to 1 wt % of hydrogen peroxide;
0.3 wt % to 1 wt % aspartic acid or salts thereof;
0.3 wt % to 2 wt % of spherical colloidal silica abrasives having a negative zeta potential and an average particle diameter of 10 nm to 23 nm; and
0.005 wt % to 0.1 wt % adenine;
optionally a biocide;
optionally, a pH adjusting agent;
optionally, a surfactant;
optionally, adipic acid, salts thereof or mixtures thereof;
a pH from 7.5 to 9;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the cobalt.

2. The method of claim 1, wherein the chemical mechanical polishing composition provided has a cobalt removal rate of ≥1500 Å/min with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad.

3. The method of claim 1, wherein the chemical mechanical polishing composition, provided consists of, as initial components:
the water;
0.1 wt % to 0.5 wt % of the hydrogen peroxide;
0.3 wt % to 0.9 wt % of the aspartic acid or salts thereof;

0.3 wt % to 1.5 wt % of the spherical colloidal silica abrasives having the negative zeta potential and a particle diameter of 20 nm to 23 nm; and, 0.01 wt % to 0.1 wt % of the adenine;

0.001 wt % to 0.05 wt % of a biocide;

optionally, the surfactant;

optionally, the adipic acid, salts thereof or mixtures thereof;

optionally, the pH adjusting agent, wherein the pH adjusting agent is KOH; and, wherein the chemical mechanical polishing composition has a pH of 8 to 9.

4. The method of claim 3, wherein the chemical mechanical polishing composition provided has a cobalt removal rate of ≥1500 Å/min with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad.

* * * * *